United States Patent
Shao et al.

(10) Patent No.: US 10,222,663 B2
(45) Date of Patent: Mar. 5, 2019

(54) ARRAY SUBSTRATE AND METHOD OF MANUFACTURING THE SAME AND DISPLAY PANEL

(71) Applicants: BOE Technology Group Co., Ltd., Beijing (CN); Beijing BOE Display Technology Co., Ltd., Beijing (CN)

(72) Inventors: Xibin Shao, Beijing (CN); Hongtao Lin, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/656,032

(22) Filed: Jul. 21, 2017

(65) Prior Publication Data
US 2018/0046040 A1  Feb. 15, 2018

(30) Foreign Application Priority Data
Aug. 9, 2016 (CN) .......................... 2016 1 0648441

(51) Int. Cl.
| | |
|---|---|
| H01L 27/14 | (2006.01) |
| G02F 1/1343 | (2006.01) |
| G02F 1/1362 | (2006.01) |
| G02F 1/1368 | (2006.01) |
| H01L 27/12 | (2006.01) |

(52) U.S. Cl.
CPC ...... *G02F 1/134309* (2013.01); *G02F 1/1368* (2013.01); *G02F 1/134363* (2013.01);
(Continued)

(58) Field of Classification Search
CPC ............... H01L 27/124; H01L 27/1259; G02F 1/136286
(Continued)

(56) References Cited

U.S. PATENT DOCUMENTS

| 5,844,641 A | 12/1998 | Jun et al. |
|---|---|---|
| 6,509,940 B2 | 1/2003 | Kwak et al. |

(Continued)

FOREIGN PATENT DOCUMENTS

| CN | 1527268 A | 9/2004 |
|---|---|---|
| CN | 101201469 A | 6/2008 |

(Continued)

OTHER PUBLICATIONS

First Office Action, including Search Report, for parallel Chinese Patent Application No. 201610648441.1, dated Nov. 16, 2018, 17 pages.

*Primary Examiner* — Tan N Tran
(74) *Attorney, Agent, or Firm* — Westman, Champlin & Koehler, P.A.

(57) ABSTRACT

The present disclosure provides an array substrate and a method of manufacturing the same, and a display panel. In an embodiment, an array substrate includes: gate lines and data lines on a base substrate; and sub-pixels defined by the gate lines and the data lines and each including a pixel electrode and a common electrode. One of the pixel electrode and the common electrode, which is away from the base substrate, includes a plurality of electrically connected electrode strips, and there is a pitch between any adjacent two of the electrode strips in a horizontal direction. The array substrate further comprises a metal wire in the sub-pixel, and the metal wire is located in a region between the pixel electrode and the data line.

19 Claims, 4 Drawing Sheets

(52) U.S. Cl.
CPC ...... *G02F 1/136286* (2013.01); *H01L 27/124* (2013.01); *H01L 27/1259* (2013.01); *G02F 2001/134372* (2013.01); *G02F 2001/136218* (2013.01); *G02F 2001/136295* (2013.01); *G02F 2201/121* (2013.01); *G02F 2201/123* (2013.01)

(58) Field of Classification Search
USPC .......................................... 257/59, 72, 432
See application file for complete search history.

(56) References Cited

U.S. PATENT DOCUMENTS

| | | | |
|---|---|---|---|
| 8,169,580 B2* | 5/2012 | Lee | G02F 1/134363 349/106 |
| 2001/0022633 A1 | 9/2001 | Kwak et al. | |
| 2002/0126251 A1* | 9/2002 | Kim | G02F 1/133707 349/190 |
| 2008/0116459 A1* | 5/2008 | Chen | H01L 27/124 257/59 |
| 2018/0083038 A1 | 3/2018 | Li et al. | |
| 2018/0224704 A1 | 8/2018 | Shao et al. | |

FOREIGN PATENT DOCUMENTS

| | | |
|---|---|---|
| CN | 105487307 A | 4/2016 |
| CN | 105824161 A | 8/2016 |
| KR | 100247628 B | 3/2000 |
| KR | 20010066348 A | 7/2001 |

* cited by examiner

ARRAY SUBSTRATE AND METHOD OF MANUFACTURING THE SAME AND DISPLAY PANEL

CROSS-REFERENCE TO RELATED APPLICATION

This application claims priority to Chinese Patent Application No. 201610648441.1 filed on Aug. 9, 2016 in the State Intellectual Property Office of China, the disclosures of which are hereby incorporated by reference in their entirety.

TECHNICAL FIELD

The present disclosure relates to the technical field of display, and particularly, to an array substrate and a method of manufacturing the same, and a display panel.

BACKGROUND

Liquid Crystal Display (for short, LCD) has advantages of low radiation, small volume, low power consumption and the likes, and is widely applied in electronic products including tablet computer, TV or mobile phone. A display panel in the liquid crystal display usually includes an array substrate and a color film substrate.

SUMMARY

According to an aspect of the present disclosure, there provides an array substrate, comprising:
  gate lines and data lines on a base substrate; and
  sub-pixels defined by the gate lines and the data lines and each including a pixel electrode and a common electrode; wherein,
  one of the pixel electrode and the common electrode, which is away from the base substrate, comprises a plurality of electrically connected electrode strips, and there is a pitch between any adjacent two of the electrode strips in a horizontal direction; and
  the array substrate further comprises a metal wire in the sub-pixel, and the metal wire is located in a region between the pixel electrode and the data line.

In some embodiments, the array substrate further comprises: a common electrode line at the same layer with the gate line, wherein the metal wire is electrically connected to the common electrode line.

In some embodiments, an orthographic projection of the metal wire on the base substrate is overlapped partially with an orthographic projection of the pixel electrode on the base substrate.

In other embodiments, there is a gap between an orthographic projection of the metal wire on the base substrate and an orthographic projection of the pixel electrode on the base substrate.

In some embodiments, each of the sub-pixels comprises a first domain and a second domain, and segments of the electrode strips in the first domain have the same extension direction while segments of the electrode strips in the second domain have the same extension direction.

In some embodiments, an angle between the extension direction of the segments of the electrode strips in the first domain and a vertical direction is in the range from 5° to 11°, and an angle between the extension direction of the segments of the electrode strips in the second domain and the vertical direction is in the range from 5° to 11°.

In some embodiments, the sub-pixel further comprises at least one thin-film transistor.

In some specific embodiments, the thin-film transistor is a U-shaped thin-film transistor.

According to another aspect of the present disclosure, there provides a display panel comprising the above array substrate.

According to yet another aspect of the present disclosure, there provides a method of manufacturing an array substrate, and the method comprises:
  forming gate lines and data lines on a base substrate; and
  defining sub-pixels by the gate lines and the data lines, each of the sub-pixels including a pixel electrode and a common electrode; wherein,
  one of the pixel electrode and the common electrode, which is away from the base substrate, comprises a plurality of electrically connected electrode strips, and there is a pitch between any adjacent two of the electrode strips in a horizontal direction; and
  the method further comprises: forming a metal wire in the sub-pixel, wherein the metal wire is located in a region between the pixel electrode and the data line.

In some embodiments, the method further comprises: forming a common electrode line while forming the gate line, wherein the metal wire is electrically connected to the common electrode line.

In some embodiments, each of the sub-pixels comprises a first domain and a second domain, and segments of the electrode strips in the first domain have the same extension direction while segments of the electrode strips in the second domain have the same extension direction.

In some embodiments, the sub-pixel further comprises at least one thin-film transistor.

In some specific embodiments, the thin-film transistor is a U-shaped thin-film transistor.

BRIEF DESCRIPTION OF THE DRAWINGS

In order to provide a more clear explanation of embodiments of the present disclosure or prior art solutions, there is provided a brief introduction of the attached drawings used in the following description of the embodiments and the prior art solutions. Obviously, the drawings mentioned in the following description merely belong to some embodiments of the present disclosure. However, for those skilled in the art, other drawings may be achieved on the basis of these attached drawings without involving any inventive steps.

DETAILED DESCRIPTION OF THE EMBODIMENTS

Figure 1:
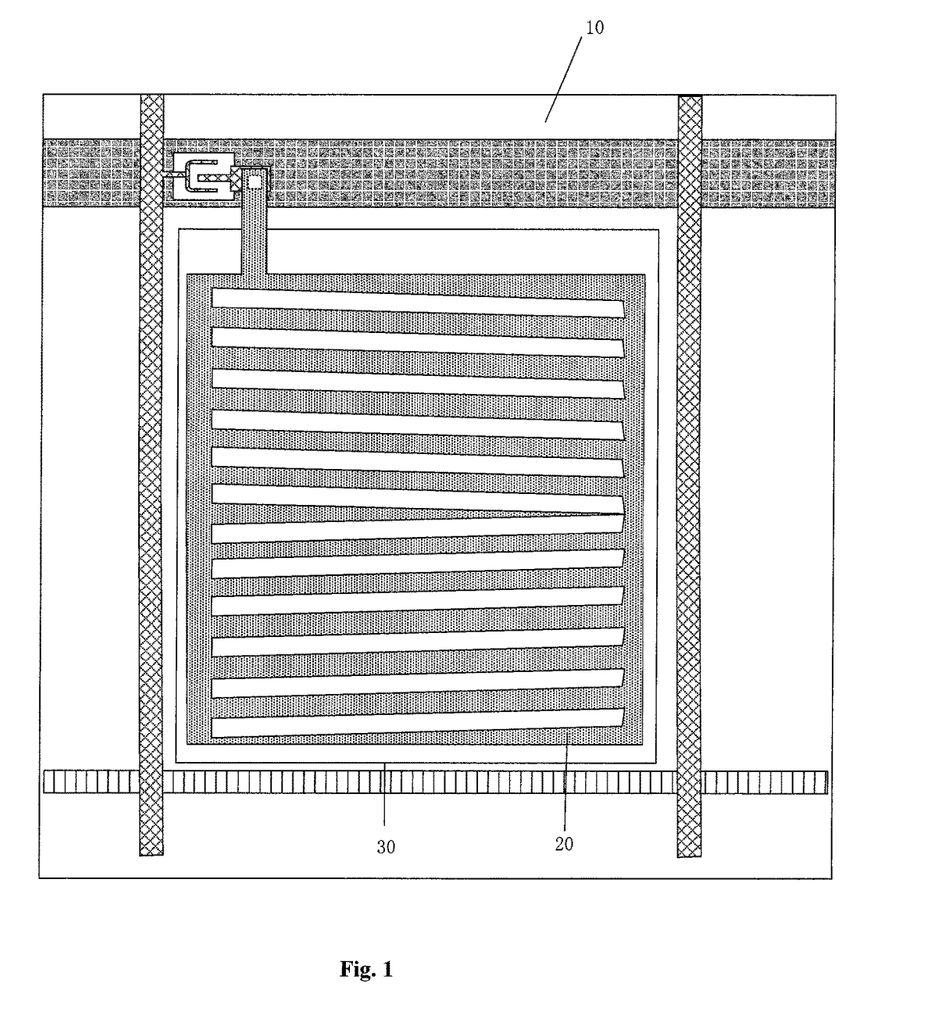
FIG. 1 is a schematic view of a structure of an array substrate.

Referring to FIG. 1, an array substrate comprises: a common electrode 30 and a pixel electrode 20 which are overlapped on a base substrate 10. One electrode, for example, the pixel electrode 20 is away from the base substrate 10, namely, the common electrode 30 is between the pixel electrode 20 and the base substrate 10. The pixel electrode 20 is configured to include a plurality of electrically connected electrode strips, and the electrode strips are arranged to tend to be parallel with a horizontal direction. With the above arrangement of the electrode, a display panel having the array substrate has a relatively great viewing angle and thus is favorable by people.

However, in the above structure of the array substrate, due to asymmetry of pixel design inherent and specific requirements of friction process itself on orientation of liquid crystal molecules and on surface conditions of orientation layer, after completing manufacturing of the orientation layer, inclination angle of liquid crystal molecules dropped on the orientation layer but located in both edge regions of the sub-pixel will not be consistent with preset angle, which causes obvious color difference when being viewed from a left-right viewing direction in case that the display panel operates under a state of lower gray scale without supplying of additional voltage, namely, a color cast phenomenon. Accordingly, the color cast phenomenon existed when the display panel being viewed from a left-right viewing direction is a poor picture quality problem which is very concerned by users, and thus brings much attentions.

Technique solutions in embodiments of the present disclosure will be described clearly and completely hereinafter in detail with reference to the attached drawings in the embodiments. Obviously, the described embodiments are only some of embodiments of the present disclosure, instead of all of the embodiments of the present disclosure. For those skilled in the art, all other embodiments achieved by referring to the following embodiments of the present disclosure without involving any inventive steps fall into the scope of the present disclosure.

Figure 2:
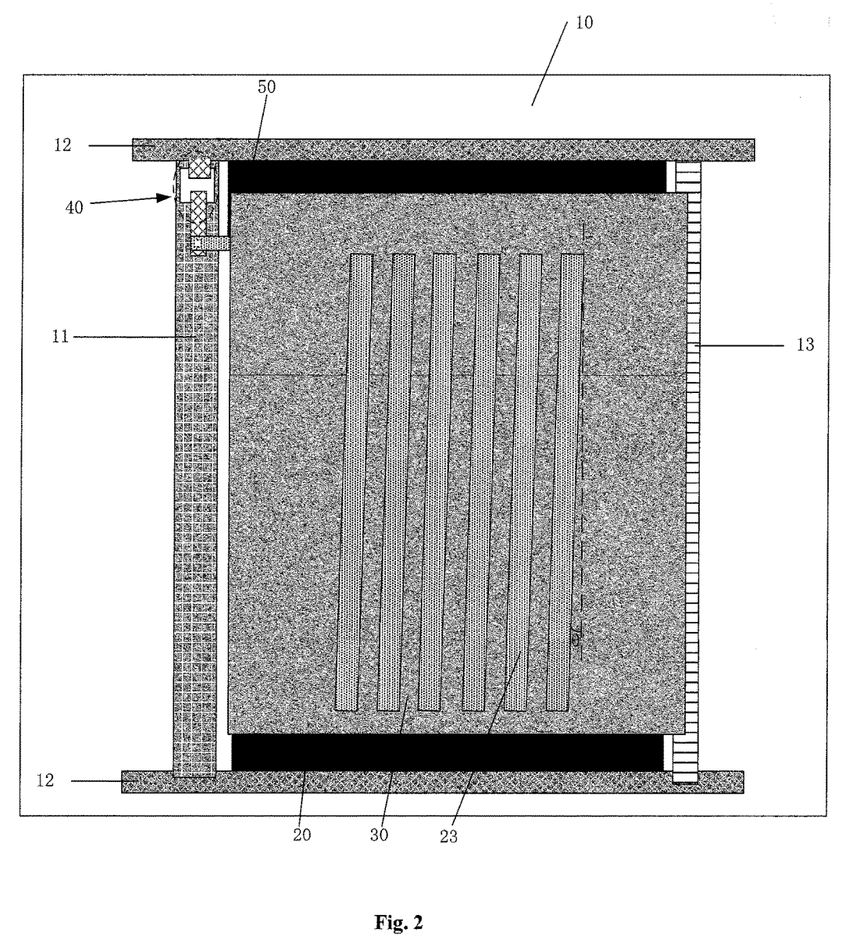
FIG. 2 is a schematic view of a structure of an array substrate according to an embodiment of the disclosure.
Figure 3:
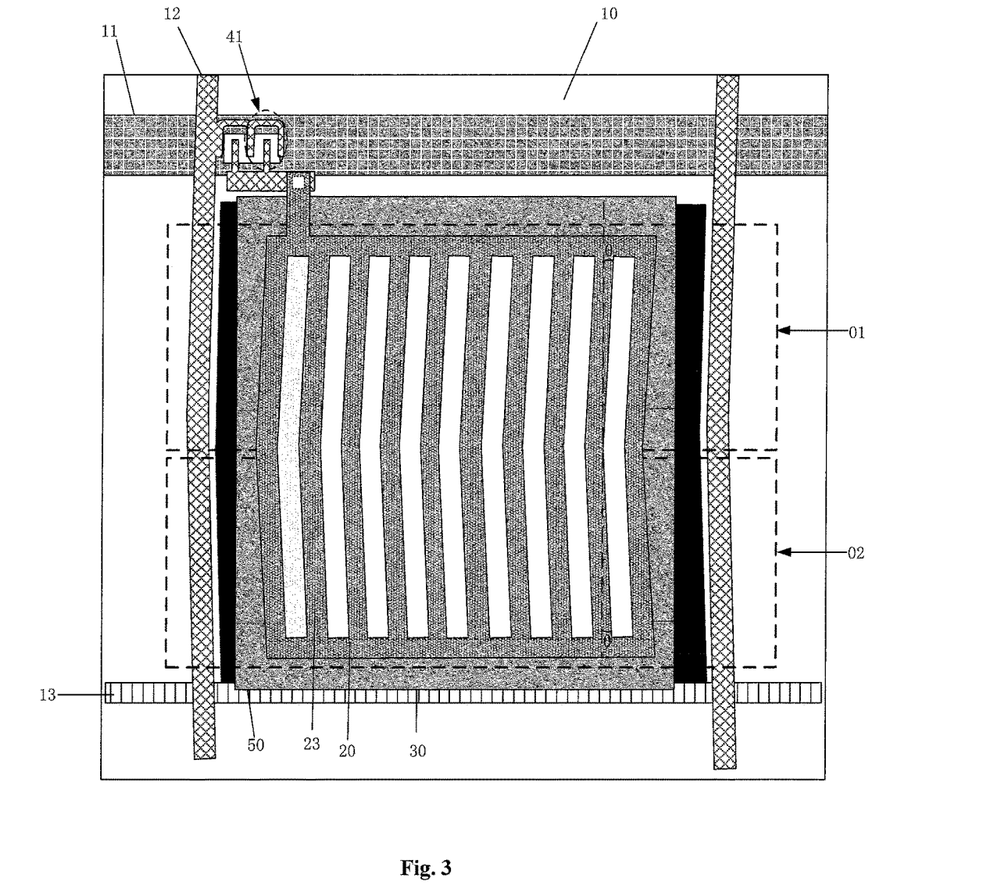
FIG. 3 is a schematic view of a structure of an array substrate according to another embodiment of the disclosure.
Figure 4:
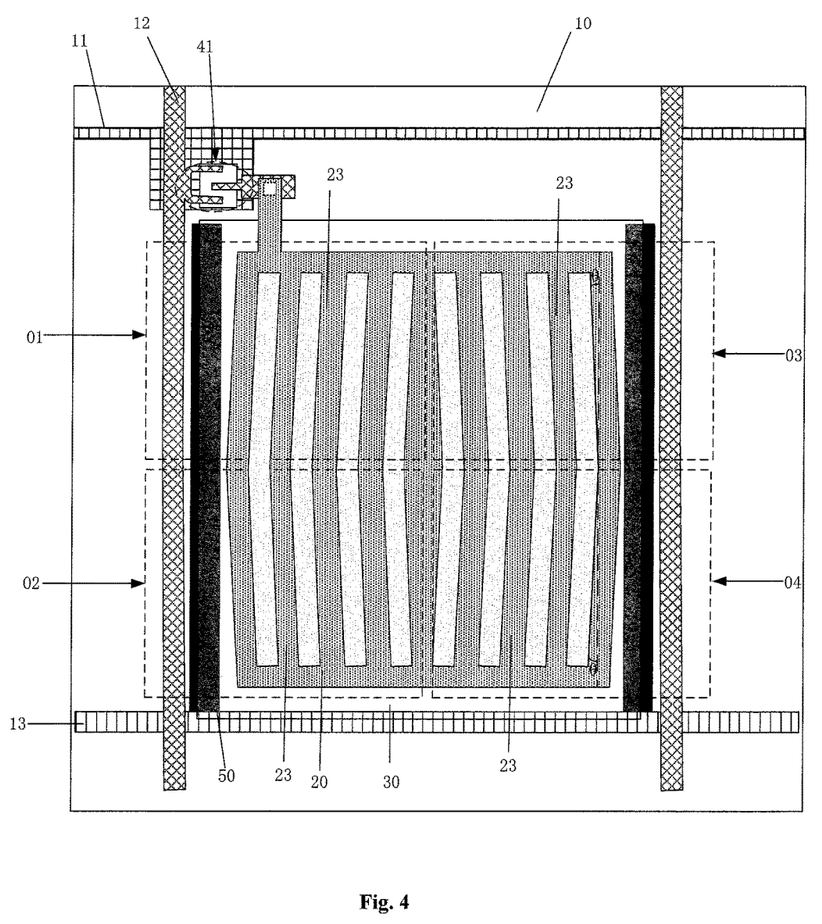
FIG. 4 is a schematic view of a structure of an array substrate according to yet another embodiment of the disclosure.

According to an embodiment of the present disclosure, referring to FIGS. 2-4, an array substrate comprises gate lines 11 and data lines 12 on a base substrate 10; and sub-pixels (one sub-pixel is taken as an example in FIGS. 2-4) defined by the gate lines 11 and the data lines 12. The sub-pixel includes a pixel electrode 20 and a common electrode 30. One of the pixel electrode 20 and the common electrode 30, which is away from the base substrate 10, comprises a plurality of electrically connected electrode strips, and there is a pitch between any adjacent two of the electrode strips in a horizontal direction.

The array substrate further comprises a metal wire 50 in the sub-pixel, and the metal wire 50 is located in a region between the pixel electrode 20 and the data line 12.

It should be noted that, firstly, the manner of arrangement of the pixel electrode 20 and the common electrode 30 is not limited. In one embodiment, the pixel electrode 20 and the common electrode 30 may be in the same layer, here, both the pixel electrode 20 and the common electrode 30 are in strip shape and are staggered.

In another embodiment, referring to FIG. 2, the pixel electrode 20 may be disposed between the base substrate 10 and the common electrode 30, here, the common electrode 30 disposed above the pixel electrode 20 is configured to include a plurality of electrically connected electrode strips.

In yet another embodiment, referring to FIGS. 3 and 4, the common electrode 30 may be disposed between the base substrate 10 and the pixel electrode 20, here, the pixel electrode 20 disposed above the common electrode 30 is configured to include a plurality of electrically connected electrode strips.

Secondly, the horizontal direction refers to a direction of a display panel to which the array substrate is applied from left to right in routine use mode of the display panel defaulted during its design process. For example, in a mobile phone, if a display panel has a rectangular shape, then, in routine use mode of the display panel defaulted during its design process, a shorter side of the display panel is in the horizontal direction while a longer side is in a vertical direction. Although current mobile phone has a function of rotating 90° or 270° in defaulted routine use mode, herein, the horizontal direction is defined in a case that a defaulted routine use mode is used in embodiments of the present disclosure. For example, in a tablet computer or in a common computer, if the display panel has a rectangular shape, then, in routine use mode of the display panel defaulted during its design process, a longer side of the display panel is in the horizontal direction while a shorter side is in a vertical direction.

Thirdly, in embodiments of the present disclosure, extension directions of the gate lines 11 and the data lines 12 are not limited. For example, in one embodiment, the gate lines 11 may be extended in the horizontal direction while the data lines 12 may be extended in the vertical direction. In another embodiment, the data lines 12 may be extended in the horizontal direction while the gate lines 11 may be extended in the vertical direction. Of course, other manners of extension may be adopted also.

Fourthly, there is a pitch between any adjacent two of the electrode strips in a horizontal direction, which refers to, in each of the sub-pixels, the electrode strips are separated from one another in the horizontal direction.

Each of the sub-pixels may include one domain, or may include several domains. In each of the domains, electrode strips are paralleled with each other. Extension directions of the electrode strips in different domains may be the same or may be different.

Fifthly, referring to FIG. 2, once there is a gap between an orthographic projection of the pixel electrode 20 on the base substrate 10 and an orthographic projection of the data line 12 on the base substrate 10, on one hand, a hop occurs in voltage signal when the pixel electrode 20 receives the voltage signal from the data line 12, so that there is a voltage difference ΔV (feedback voltage) between a voltage actually received by the pixel electrode 20 and a voltage of the data line 12. On the other hand, for example, in one frame, electrical powers charged via one data line 12 to the pixel electrodes 20 in different rows are not exactly the same, that is, electric potential of the data line 12 continuously varies when the pixel electrodes 20 in different rows are charged, which causes a voltage difference between electric potential of the pixel electrode 20 and continuously varying electric potential of the data line 12. Due to presence of the feedback voltage or the voltage difference ΔV, an electrical field coupling occurs in a spatial region between the data line 12 and a portion of the pixel electrode 20 located at an edge of the sub-pixel, which leads to a difference between orientation of the liquid crystal molecule within this spatial region and orientation of the liquid crystal molecule within a non-edge region of the sub-pixel. As a result, in some lower gray scales, liquid crystal molecule within the non-edge region of the sub-pixel is in its pretilt angle and has no light leakage, while, liquid crystal molecule within the spatial region between the data line 12 and the portion of the pixel electrode 20 located at the edge of the sub-pixel deflects under the action of the electrical field coupling, which causes light leakage at the edge of the sub-pixel.

Once an orthographic projection of the pixel electrode 20 on the base substrate 10 is overlapped partially with orthographic projection of the data line 12 on the base substrate 10, here, there still has some light leakage, however, since the pixel electrode 20 is extended towards the data line 12 and is overlapped with the data line 12, a light leakage region is moved to be above the data line 12 and thus is blocked by black matrix of a color film substrate. But, this will increase load of the data line 12 to sharply increase power consumption of the array substrate. The load of the data line 12 is not obviously increased when the array substrate is applied to a small-sized display panel, while, it is significantly increased when the array substrate is applied to a large-sized display panel.

To this end, in order to avoid increase of the load of the data line 12, as shown in FIG. 2, according to the present disclosure, a pitch is still provided between the pixel electrode 20 and the data line 12, besides, a metal wire 50 is provided in a region between the pixel electrode 20 and the data line 12, for solving the problem of light leakage.

In one embodiment, referring to FIG. 2, the metal wire 50 is provided in a region between the pixel electrode 20 and the data line 12. An orthographic projection of the metal wire 50 on the base substrate 10 may be overlapped partially with orthographic projections of the pixel electrode 20 and the data line 12 on the base substrate 10, or else, a gap may be provided between the orthographic projection of the metal wire 50 on the base substrate 10 and orthographic projections of the pixel electrode 20 and the data line 12 on the base substrate 10. It should be noted that, in a case that the orthographic projection of the metal wire 50 is overlapped partially with the orthographic projection of the pixel electrode 20, an overlapping area between the metal wire 50 and the pixel electrode 20 should be as small as possible, in order to increase aperture ratio of the array substrate.

Accordingly, according to embodiments of the present disclosure, there provides an array substrate in which, one of the pixel electrode 20 and the common electrode 30, which is away from the base substrate 10, is provided to include a plurality of electrically connected electrode strips, and there is a pitch between any adjacent two of the electrode strips in a horizontal direction. As a result, when this array substrate is applied to a display panel, a color cast phenomenon under a state of lower gray scale without supplying of additional voltage is transferred from a left-right viewing direction to an up-down viewing direction, and, the color cast phenomenon in the up-down viewing direction is omitted by user. Accordingly, the color cast phenomenon in the left-right viewing direction occurred in the prior art display panel is solved.

Besides, according to embodiments of the present disclosure, a metal wire 50 is provided in the region between the pixel electrode 20 and the data line 12, and a voltage signal which is the same as that applied to the pixel electrode 20 is applied to the metal wire 50 under a state of lower gray scale, so that, between the metal wire 50 and the pixel electrode 20, there is no voltage difference, and thus no electrical field coupling. As a result, orientation of the liquid crystal molecule within this spatial region between the data line 12 and the portion of the pixel electrode 20 located at the edge of the sub-pixel and orientation of the liquid crystal molecule within the non-edge region of the sub-pixel are the same, thereby solving the problem of light leakage in the edge of the sub-pixel.

Technique solutions according to the present disclosure will be described hereinafter in conjunction with specific embodiments of the present disclosure.

In one exemplary embodiment, referring to FIG. 2, an array substrate comprises: gate lines 11 and data lines 12 on a base substrate 10; and sub-pixels defined by the gate lines 11 and the data lines 12. The data lines 12 extend in a horizontal direction and the gate lines 11 extend in a vertical direction substantially perpendicular to the horizontal direction. Each of the sub-pixels includes a pixel electrode 20, a common electrode 30 and a thin-film transistor 40. The common electrode 30 is disposed above the pixel electrode 20 and includes a plurality of electrically connected electrode strips 23. The adjacent electrode strips 23 have the same extension direction, and there is a pitch between any adjacent two of the electrode strips 23 in the extension direction of the data lines 12.

Moreover, the array substrate further comprises a common electrode line 13 electrically connected to the common electrode 30, and a metal wire 50 disposed in the sub-pixel. The metal wire 50 is located in a region between the pixel electrode 20 and the data line 12. An orthographic projection of the metal wire 50 on the base substrate 10 is overlapped partially with an orthographic projection of the pixel electrode 20 on the base substrate 10 and an orthographic projection of the data line 12 on the base substrate 10. Each of the sub-pixels comprises only one domain. There is an angle θ, ranged from 0° to 45°, between the extension direction of the electrode strips 23 and the vertical direction.

It should be noted that, the above range of the angle θ may be adopted in other embodiments of the present disclosure.

Meanwhile, an orthographic projection of the metal wire 50 on the base substrate 10 is overlapped partially with orthographic projections of the pixel electrode 20 and the data lines 12 on the base substrate 10, which makes a light emitted from an incident side at bottom of the array substrate to be blocked by the metal wire 50, so that no incidence of light exists in a spatial region between a portion of the pixel electrode 20 located at an edge of the sub-pixel and the data line 12. In this way, even if no voltage signal which is the same as that applied to the pixel electrode 20 is applied to the metal wire 50, the color cast problem on left-right viewing angle is solved while the light leakage at the edge of the sub-pixel is solved as well.

In another exemplary embodiment, referring to FIG. 3, an array substrate comprises: gate lines 11 and data lines 12 on a base substrate 10; and sub-pixels defined by the gate lines 11 and the data lines 12. The gate lines 11 extend in a horizontal direction and the data lines 12 extend in a vertical direction substantially perpendicular to the horizontal direction. Each of the sub-pixels includes a pixel electrode 20, a common electrode 30, and two U-shaped thin-film transistors 41 connected in series. The pixel electrode 20 is disposed above the common electrode 30 and includes a plurality of electrically connected electrode strips 23. The adjacent electrode strips 23 have the same extension direction, and there is a pitch between any adjacent two of the electrode strips 23 in the extension direction of the gate lines 11.

Moreover, the array substrate further comprises a metal wire 50 disposed in the sub-pixel. The metal wire 50 is located in a region between the pixel electrode 20 and the data line 12. An orthographic projection of the metal wire 50 on the base substrate 10 is overlapped partially with an orthographic projection of the pixel electrode 20 on the base substrate 10. While, there is a gap between the orthographic projection of the metal wire 50 on the base substrate 10 and an orthographic projection of the data line 12 on the base substrate 10. In this exemplary embodiment, each of the sub-pixels comprises a first domain 01 and a second domain 02, and segments of the electrode strips in the first domain 01 have the same extension direction which makes an angle of θ with a vertical direction, while, segments of the electrode strips in the second domain 02 have the same extension direction which also makes an angle of θ with the vertical direction. Extension direction of the segments of the electrode strips in the first domain 01 is different from extension direction of the segments of the electrode strips in the second domain 02. Extension directions of the data line 12 and the metal wire 50 are substantially the same as extension direction of the whole electrode strip 23. The metal wire 50 is electrically connected to a common electrode line 13, and, the common electrode line 13 is disposed in the same layer as the gate line 11.

It should be noted that, as shown in FIG. 3, an electrode, for example a source, of a U-shaped thin-film transistor 41 connected to the data line 11 is a U-shaped source, another electrode, for example a drain, is inserted into the U-shaped source, and, an active layer is below the source and the drain.

In other words, two U-shaped thin-film transistors 41 in series are configured so that, the U-shaped sources of the two thin-film transistors are connected to each other, while the drains of the two thin-film transistors are connected to each other.

In addition, since each of the sub-pixels comprises a first domain 01 and a second domain 02, light can be emitted from a plurality of directions, which alleviates difference among colors of light at different viewing angles. In addition, provision of the two U-shaped thin-film transistors 41 in series in the sub-pixel increases width to length ratio of channel while ensuring an aperture ratio of pixel, thereby enhancing charging capacity of the thin-film transistor and improving display quality.

In yet another exemplary embodiment, referring to FIG. 4, an array substrate comprises: gate lines 11 and data lines 12 on a base substrate 10; and sub-pixels defined by the gate lines 11 and the data lines 12. The gate lines 11 extend in a horizontal direction and the data lines 12 extend in a vertical direction substantially perpendicular to the horizontal direction. Each of the sub-pixels includes a pixel electrode 20, a common electrode 30, and U-shaped thin-film transistors 41. The pixel electrode 20 is disposed above the common electrode 30 and includes a plurality of electrically connected electrode strips 23. There is a pitch between any adjacent two of the electrode strips 23 in the extension direction of the gate lines 11.

Moreover, the array substrate further comprises a metal wire 50 disposed in the sub-pixel. The metal wire 50 extends in the vertical direction, and is located in a region between the pixel electrode 20 and the data line 12. There is a gap between the orthographic projection of the metal wire 50 on the base substrate 10 and orthographic projections of the pixel electrode 20 and the data line 12 on the base substrate 10. In this exemplary embodiment, each of the sub-pixels comprises a first domain 01 and a second domain 02, and a third domain 03 and a fourth domain 04 being respectively in mirror symmetry with the first domain 01 and the second domain 02. Both an extension direction of segments of the electrode strips in the first domain 01 and an extension direction of segments of the electrode strips in the second domain 02 make an angle of θ with the vertical direction, but the extension direction of the segments of the electrode strips in the first domain 01 is different from the extension direction of the segments of the electrode strips in the second domain 02. Similarly, both an extension direction of segments of the electrode strips in the third domain 03 and an extension direction of segments of the electrode strips in the fourth domain 04 make an angle of θ with the vertical direction, but the extension direction of the segments of the electrode strips in the third domain 03 is different from the extension direction of the segments of the electrode strips in the fourth domain 04. The metal wire 50 is disposed in the same layer as and is electrically connected to a common electrode line 13.

In addition, the metal wire 50 is configured to be disposed in the same layer as and be electrically connected to the common electrode line 13, so that times of patterning process can be reduced.

The above description is merely used to illustrate some exemplary embodiments of the present disclosure, and is not to completely cover all the embodiments of the present disclosure. Any arbitrary combinations of these features in the above embodiments should be included within the scope of the present disclosure.

According to the above exemplary embodiments of the present disclosure, an angle between extension direction of the electrode strips 23 (or the segments of the electrode strips 23) and a vertical direction is in the range from 5° to 11°.

Herein, the vertical direction is a direction which is perpendicular to the horizontal direction.

In these embodiments of the present disclosure, the angle between extension direction of the electrode strips 23 (or the segments of the electrode strips 23) and a vertical direction is set to be in the range from 5° to 11°, which ensures display quality at one hand, and reduces power consumption on the other hand.

According to embodiments of the present disclosure, there also provides a display panel comprising the above-mentioned array substrate and, of course, a substrate to be assembled with the array substrate.

The metal wire 50 may receive voltage signal via an independent voltage control unit, or may be electrically connected to the common electrode line 13 directly.

Accordingly, according to embodiments of the present disclosure, there provides a display panel, in which, one of the pixel electrode 20 and the common electrode 30 in an array substrate, which is away from the base substrate 10, is provided to include a plurality of electrically connected electrode strips 23, and there is a pitch between any adjacent two of the electrode strips 23 in a horizontal direction. As a result, a color cast phenomenon under a state of lower gray scale without supplying of additional voltage is transferred from a left-right viewing direction to an up-down viewing direction, and, the color cast phenomenon in the up-down viewing direction is omitted by user. Accordingly, the color cast phenomenon in the left-right viewing direction occurred in the prior art display panel is solved.

Besides, according to embodiments of the present disclosure, a metal wire 50 is provided in the region between the pixel electrode 20 and the data line 12, and a voltage signal which is the same as that applied to the pixel electrode 20 is applied to the metal wire 50 under a state of lower gray scale, so that, between the metal wire 50 and the pixel electrode 20, there is no voltage difference, and thus no electrical field coupling. As a result, orientation of the liquid crystal molecule within this spatial region between the data line 12 and the portion of the pixel electrode 20 located at the edge of the sub-pixel and orientation of the liquid crystal molecule within the non-edge region of the sub-pixel are the same, thereby solving the problem of light leakage in the edge of the sub-pixel.

According to embodiments of the present disclosure, there further provides a display apparatus comprising the abovementioned display panel.

The abovementioned display apparatus may specifically be a liquid crystal display apparatus, and may be any products or parts having a display function, including a liquid crystal display, a liquid crystal TV, a digital frame, a mobile phone, a tablet computer and the like.

According to embodiments of the present disclosure, there further provides a method of manufacturing an array substrate. Referring to FIGS. 2 to 4, the method comprises: forming gate lines 11 and data lines 12 on a base substrate 10; and defining sub-pixels by the gate lines 11 and the data lines 12, each of the sub-pixels including a pixel electrode 20 and a common electrode 30. One of the pixel electrode 20 and the common electrode 30, which is away from the base substrate 10, comprises a plurality of electrically connected electrode strips 23, and there is a pitch between any adjacent two of the electrode strips 23 in a horizontal direction.

Besides, the method further comprises: forming a metal wire 50 in the sub-pixel, wherein the metal wire 50 is located in a region between the pixel electrode 20 and the data line 12.

It should be noted that, firstly, extension directions of the gate lines 11 and the data lines 12 are not limited. In one embodiment, the gate lines 11 may extend in the horizontal direction and the data lines 12 may extend in the vertical direction, or, the data lines 12 may extend in the horizontal direction and the gate lines 11 may extend in the vertical direction. Of course, other extension directions may be adopted also.

Secondly, an orthographic projection of the metal wire 50 on the base substrate 10 may be overlapped partially with orthographic projections of the pixel electrode 20 and the data line 12 on the base substrate 10, or else, a gap may be provided between the orthographic projection of the metal wire 50 on the base substrate 10 and orthographic projections of the pixel electrode 20 and the data line 12 on the base substrate 10. It should be noted that, in a case that the orthographic projection of the metal wire 50 is overlapped partially with the orthographic projection of the pixel electrode 20, an overlapping area between the metal wire 50 and the pixel electrode 20 should be as small as possible, in order to increase aperture ratio of the array substrate.

Accordingly, according to embodiments of the present disclosure, there provides a method of manufacturing an array substrate, in which, one of the pixel electrode 20 and the common electrode 30 on a base substrate 10, which is away from the base substrate 10, is provided to include a plurality of electrically connected electrode strips 23, and there is a pitch between any adjacent two of the electrode strips 23 in a horizontal direction. As a result, once the array substrate is applied to a display panel, a color cast phenomenon under a state of lower gray scale without supplying of additional voltage is transferred from a left-right viewing direction to an up-down viewing direction, and, the color cast phenomenon in the up-down viewing direction is omitted by user. Accordingly, the color cast phenomenon in the left-right viewing direction occurred in the prior art display panel is solved.

Besides, according to embodiments of the present disclosure, a metal wire 50 is provided in the region between the pixel electrode 20 and the data line 12, and a voltage signal which is the same as that applied to the pixel electrode 20 is applied to the metal wire 50 under a state of lower gray scale, so that, between the metal wire 50 and the pixel electrode 20, there is no voltage difference, and thus no electrical field coupling. As a result, orientation of the liquid crystal molecule within this spatial region between the data line 12 and the portion of the pixel electrode 20 located at the edge of the sub-pixel and orientation of the liquid crystal molecule within the non-edge region of the sub-pixel are the same, thereby solving the problem of light leakage in the edge of the sub-pixel.

In some embodiments, as shown in FIG. 3 and FIG. 4, the method further comprises: forming a common electrode line 13 while forming the gate line 11, wherein the metal wire 50 is electrically connected to the common electrode line 13.

In some embodiments, the metal wire 50 is formed while forming the gate line 11 and the common electrode line 13.

Since voltage on the pixel electrode 20 is the same as the common voltage under a state of lower gray scale, in these embodiments of the present disclosure, the metal wire 50 is electrically connected to the common electrode line 13. Accordingly, the common voltage can be supplied to the metal wire 50 directly through the common electrode line 13, which simplifies a structure of the array substrate.

In some embodiments, as shown in FIG. 3, each of the sub-pixels comprises a first domain 01 and a second domain 02, and segments of the electrode strips in the first domain 01 have the same extension direction while segments of the electrode strips in the second domain 02 have the same extension direction.

In these embodiments of the present disclosure, each of the sub-pixels comprises the first domain 01 and the second domain 02, so that light can be emitted from a plurality of directions, which alleviates difference among colors of light at different viewing angles.

In some embodiments, in order that light is emitted from a plurality of directions to further alleviate difference among colors of light at different viewing angles, extension direction of segments of the electrode strips in the first domain 01 is different from extension direction of segments of the electrode strips in the second domain 02, as shown in FIG. 4 for example.

In some embodiments, the sub-pixel further comprises at least one thin-film transistor 40.

In embodiments of the present disclosure, there provides at least one thin-film transistor 40, which increases width to length ratio of channel while ensuring an aperture ratio of pixel, thereby enhancing charging capacity of the thin-film transistor and improving display quality.

In order to further improve display quality, in some embodiments, the thin-film transistor is a U-shaped thin-film transistor.

The above merely are specific embodiments of the present disclosure, but the scope of the present disclosure is not limited to this. It will be apparent for those skilled in the art that some changes and modifications on these embodiments may be made without departing from the principles and spirit of the present disclosure, the scope of which is defined in the claims and their equivalents.

What is claimed is:

1. An array substrate, comprising:
   gate lines and data lines on a base substrate; and
   sub-pixels defined by the gate lines and the data lines and each including a pixel electrode and a common electrode; wherein,
   one of the pixel electrode and the common electrode, which is away from the base substrate, comprises a plurality of electrically connected electrode strips, and there is a pitch between any adjacent two of the electrode strips in a horizontal direction; and
   the array substrate further comprises a metal wire in the sub-pixel, the metal wire is located in a region between the pixel electrode and the data line, and a length of the metal wire in the sub-pixel is substantially not less than a length of the sub-pixel along which the metal wire extends.

2. The array substrate of claim 1, further comprising: a common electrode line at the same layer with the gate line, wherein the metal wire is electrically connected to the common electrode line.

3. The array substrate of claim 2, wherein, an orthographic projection of the metal wire on the base substrate is overlapped partially with an orthographic projection of the pixel electrode on the base substrate.

4. The array substrate of claim 2, wherein, there is a gap between an orthographic projection of the metal wire on the base substrate and an orthographic projection of the pixel electrode on the base substrate.

5. The array substrate of claim 2, wherein, each of the sub-pixels comprises a first domain and a second domain, and segments of the electrode strips in the first domain have the same extension direction while segments of the electrode strips in the second domain have the same extension direction.

6. The array substrate of claim 5, wherein, an angle between the extension direction of the segments of the electrode strips in the first domain and a vertical direction is in the range from 5° to 11° and an angle between the extension direction of the segments of the electrode strips in the second domain and the vertical direction is in the range from 5° to 11°.

7. The array substrate of claim 1, wherein, an orthographic projection of the metal wire on the base substrate is overlapped partially with an orthographic projection of the pixel electrode on the base substrate.

8. The array substrate of claim 1, wherein, there is a gap between an orthographic projection of the metal wire on the base substrate and an orthographic projection of the pixel electrode on the base substrate.

9. The array substrate of claim 1, wherein, each of the sub-pixels comprises a first domain and a second domain, and segments of the electrode strips in the first domain have the same extension direction while segments of the electrode strips in the second domain have the same extension direction.

10. The array substrate of claim 9, wherein, an angle between the extension direction of the segments of the electrode strips in the first domain and a vertical direction is in the range from 5° to 11°, and an angle between the extension direction of the segments of the electrode strips in the second domain and the vertical direction is in the range from 5° to 11°.

11. The array substrate of claim 1, wherein, the sub-pixel further comprises at least one thin-film transistor.

12. The array substrate of claim 11, wherein, the thin-film transistor is a U-shaped thin-film transistor.

13. A display panel comprising the array substrate of claim 1.

14. A method of manufacturing an array substrate, the method comprising:
forming gate lines and data lines on a base substrate; and
defining sub-pixels by the gate lines and the data lines, each of the sub-pixels including a pixel electrode and a common electrode; wherein,
one of the pixel electrode and the common electrode, which is away from the base substrate, comprises a plurality of electrically connected electrode strips, and there is a pitch between any adjacent two of the electrode strips in a horizontal direction; and
the method further comprises: forming a metal wire in the sub-pixel, wherein the metal wire is located in a region between the pixel electrode and the data line, and a length of the metal wire in the sub-pixel is substantially not less than a length of the sub-pixel along which the metal wire extends.

15. The method of claim 14, further comprising: forming a common electrode line while forming the gate line, wherein the metal wire is electrically connected to the common electrode line.

16. The method of claim 15, wherein, each of the sub-pixels comprises a first domain and a second domain, and segments of the electrode strips in the first domain have the same extension direction while segments of the electrode strips in the second domain have the same extension direction.

17. The method of claim 14, wherein, each of the sub-pixels comprises a first domain and a second domain, and segments of the electrode strips in the first domain have the one same extension direction while segments of the electrode strips in the second domain have the same extension direction.

18. The method of claim 14, wherein, the sub-pixel further comprises at least one thin-film transistor.

19. The method of claim 18, wherein, the thin-film transistor is a U-shaped thin-film transistor.

* * * * *